(12) United States Patent
Lin et al.

(10) Patent No.: US 7,633,348 B2
(45) Date of Patent: Dec. 15, 2009

(54) FREQUENCY-LOCKING DEVICE AND FREQUENCY-LOCKING METHOD THEREOF

(75) Inventors: Yong Jheng Lin, Tai Hsi Hsiang (TW); Wen Hsiang Huang, Hsin Chu (TW); Min-Yi Chen, Chu Pei (TW)

(73) Assignee: SONIX Technology Co., Ltd., Hsinchu (TW)

( * ) Notice: Subject to any disclaimer, the term of this patent is extended or adjusted under 35 U.S.C. 154(b) by 125 days.

(21) Appl. No.: 11/706,199

(22) Filed: Feb. 15, 2007

(65) Prior Publication Data

US 2008/0100388 A1  May 1, 2008

(30) Foreign Application Priority Data

Nov. 1, 2006 (TW) ............................... 95140350 A

(51) Int. Cl.
*H03L 7/099* (2006.01)
*G06F 13/00* (2006.01)

(52) U.S. Cl. .................... 331/44; 327/160; 710/100

(58) Field of Classification Search ............ 331/44, 331/16, 17, 1 A; 713/401; 710/302, 100; 327/160

See application file for complete search history.

(56) References Cited

U.S. PATENT DOCUMENTS 4,380,742 A * 4/1983 Hart ........................... 331/1 A
6,677,824 B2 * 1/2004 Harpham ....................... 331/17
6,703,878 B2 * 3/2004 Soumyanath et al. ........ 327/157
6,950,957 B1 * 9/2005 O'Leary ....................... 713/401
7,043,587 B2 * 5/2006 Burke et al. ................. 710/302
7,183,860 B2 * 2/2007 Staszewski et al. .......... 331/1 A
2004/0232997 A1 * 11/2004 Hein et al. ..................... 331/16
2006/0158260 A1 * 7/2006 Da Dalt ........................ 331/16
2006/0215798 A1 * 9/2006 Nelson ........................ 375/376
2007/0090884 A1 * 4/2007 Kuppusamy et al. .......... 331/16

* cited by examiner

*Primary Examiner*—James H. Cho
*Assistant Examiner*—Crystal L Hammond
(74) *Attorney, Agent, or Firm*—Muncy, Geissler, Olds & Lowe, PLLC

(57) ABSTRACT

A frequency-locking device including a digitally-controlled oscillator (DCO) and a comparing unit is disclosed. The DCO is used for generating an output frequency signal. The comparing unit receives a Keep Alive signal from a universal serial bus (USB) and the output frequency signal, and compares the Keep Alive signal with the output frequency signal to generate a calibration signal. Then, the DCO adjusts the frequency of the output frequency signal according to the calibration signal to meet the USB specification for data communication.

12 Claims, 9 Drawing Sheets

FREQUENCY-LOCKING DEVICE AND FREQUENCY-LOCKING METHOD THEREOF

BACKGROUND OF THE INVENTION

1. Field of the Invention

The present invention relates to a frequency-locking device and, more particularly, to a frequency-locking device applied to universal serial bus.

2. Description of the Related Art

As shown in FIG. 1, a frequency-locking device 10 applied to data communication of a universal serial bus was disclosed in U.S. Pat. No. 6,297,705. When the frequency-locking device 10 is used, the output clock of an oscillator 142 is locked to the rate of incoming data stream which input to the frequency-locking device 10. The object of this technology is to precisely lock the output clock of the oscillator 142 to the rate of the incoming data stream without utilizing any external precision timing element such as a crystal or a resonator, and provide multiple tuning phases during inputting a single data packet via coarse and/or fine tuning.

Referring to FIG. 1, the frequency-locking device 10 includes a control circuit 102 and an oscillator logic circuit 104. The control circuit 102 receives an incoming data stream DATA and an input signal PACKET, and outputs a control signal CNTR and a correction signal FACTOR. The incoming data stream DATA are a series of data packets. The frequency-locking device 10 measures the incoming data stream DATA in advance to generate the correction signal FACTOR, and then the correction signal FACTOR is used to alter the oscillation frequency of the output signal OUT so that the frequency is locked to the rate of the incoming data stream DATA.

The control circuit 102 includes a control logic unit 103 and a counter circuit 106. The control logic unit 103 outputs an adjustment signal C/F and a control signal CNTRS/S to the counter circuit 106. Herein, the frequency-locking device 10 coarsely or finely tunes the oscillation frequency of the output signal OUT according to the adjustment signal C/F and the entire packet signal (the input signal PACKET). The control signal CNTRS/S is used to start or stop the counter circuit 106. The counter circuit 106 includes a calibration circuit such as the start/stop counter 150 and a look-up table 152. The look-up table 152 stores a fixed table of known characters in relation to adjustment of the oscillation frequency of the output signal OUT, and generates the correction signal FACTOR according to the adjustment signal C/F and the counts of the start/stop counter 150. The correction signal FACTOR is then used to control an adjustment in the oscillation frequency of the output signal OUT.

The oscillator logic circuit 104 includes an oscillator control circuit 140 and an oscillator 142. The oscillator logic circuit 104 receives the control signal CNTR and the correction signal FACTOR and generates the output signal OUT. The control signal CNTR is used in determination of whether the oscillation frequency of the output signal OUT is to be adjusted. The correction signal FACTOR represents an offset value (a multi-bit digital value) of a coarse tuning or a fine tuning for the oscillating signal DIGOUT. The oscillator 142 generates the output signal OUT according to the oscillating signal DIGOUT.

The coarse and fine tuning approach for the conventional frequency-locking device 10 is described as follows. First, the start/stop counter 150 performs a coarse tuning by counting a pre-determined number of edges of the input signal PACKET, feeding the counting value to the look-up table 152 for finding out a correction factor corresponding to the counting value so as to generate the correction signal FACTOR to an adder 163. The adder 163 adds the value of the correction signal FACTOR to the originally set value ST and then sends the sum value to the oscillator setting unit 160 to generate the oscillating signal DIGOUT. Then, fine tuning is recurrently applied to the output signal OUT for a longer period of time to gain more precise adjustment. In other words, the start/stop counter 150 starts fine tuning when the coarse tuning is completed, and generates offset value by referring to the fine-tuning factors from the look-up table 152, and adds or subtracts the value of the signal DIGOUT with the offset value according to the correction signal FACTOR. Thereby, the obtained oscillating frequency for the output signal OUT of the oscillator 142 fits the requirement, and the frequency of the output signal OUT is precisely locked to the rate of the incoming data stream.

However, the way of generating the correction signal FACTOR according to the data packets of the universal serial bus makes the actual design and operation of circuit more complicated and defective. Besides, the great amount of memory space occupied by the look-up table inside the frequency-locking device 10 increases the memory cost for the frequency-locking device 10. The above-mentioned problems highly raise the manufacturing cost and the electricity consumption of the whole device.

SUMMARY OF THE INVENTION

In view of the above-mentioned problems, the present invention provides a frequency-locking device with advantages of low-producing cost, less-complicated design, and low electricity consumption. The frequency-locking device according to one embodiment of the invention includes a digitally-controlled oscillator and a comparing unit. The digitally-controlled oscillator is used to generate an output frequency signal. The comparing unit receives a KEEP ALIVE signal and the output frequency signal, and then compares the KEEP ALIVE signal with the output frequency signal to generate a calibration signal. The digitally-controlled oscillator performs an adjustment according to the calibration signal to lock the frequency of the output frequency signal to a specific or predetermined frequency for data communication.

On the other hand, a frequency-locking method is also provided. The method comprises the following steps. The first step is to receive a KEEP ALIVE signal. Then, it is the step of filtering noises of the KEEP ALIVE signal. Next, it is the step of comparing the filtered KEEP ALIVE signal with an output frequency signal to generate a calibration signal. Finally, it is the step of adjusting the output frequency signal according to the calibration signal so as to lock the frequency of the output frequency signal to a specific or predetermined frequency applied to data communication.

In the embodiments of the invention, the frequency-locking device and method thereof takes a KEEP ALIVE signal as a reference for the calibration signal rather than takes a more complicated packet data as references for correction, and which shows a more precise frequency-locking effect. Also, the present invention does not need any look-up table. Consequently, the circuit design for the present invention becomes easier and the effect of reduced complexity in design, lowered production cost, and lowered electricity consumption can be obtained.

DETAILED DESCRIPTION OF THE EMBODIMENTS

Reference will now be made to the drawings in which the various elements of the present invention will be given numerical designations and in which the invention will be discussed so as to enable one skilled in the art to make and use the invention.

Figure 1:
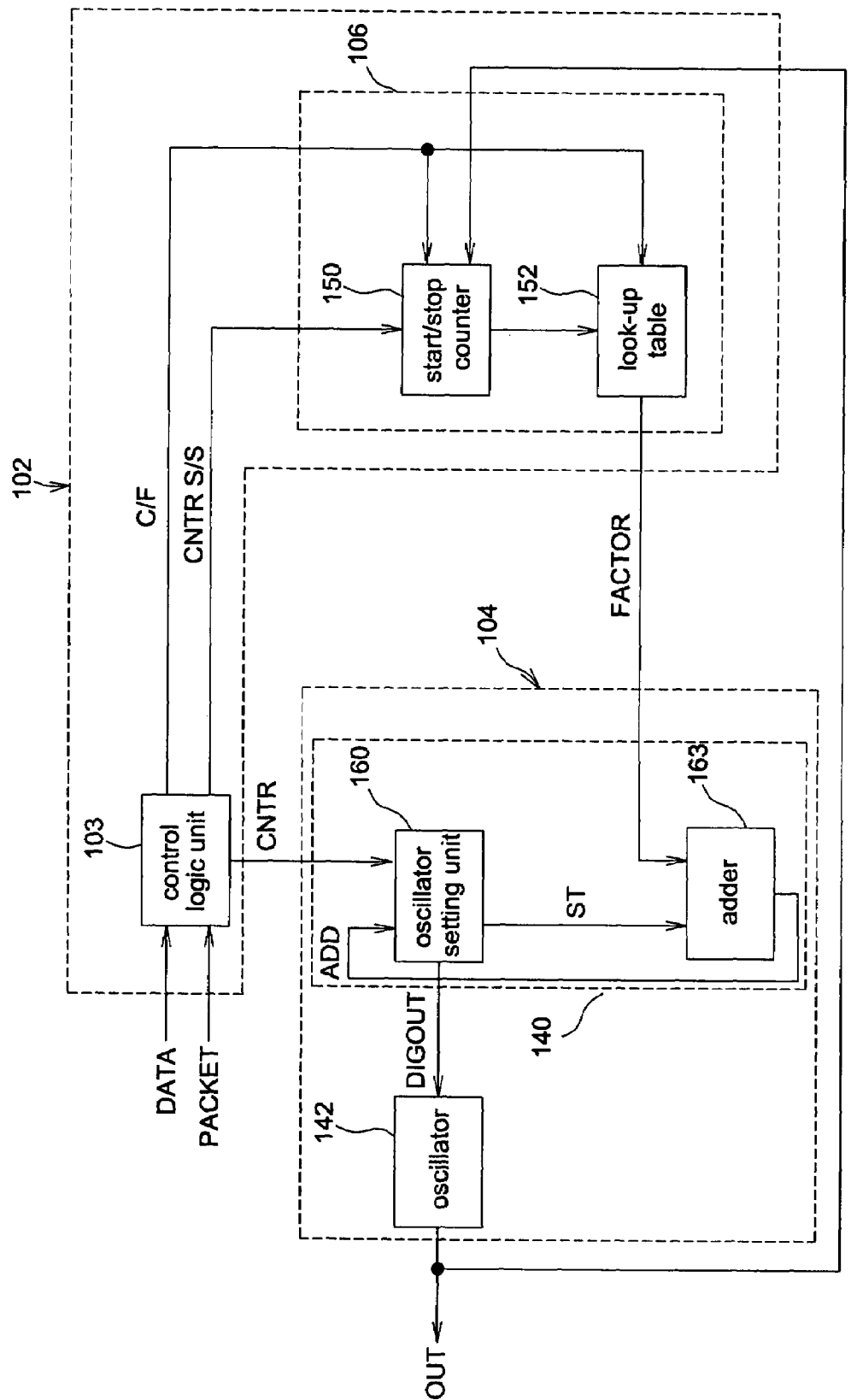
FIG. 1 shows a schematic diagram illustrating a conventional frequency-locking device.
Figure 2:
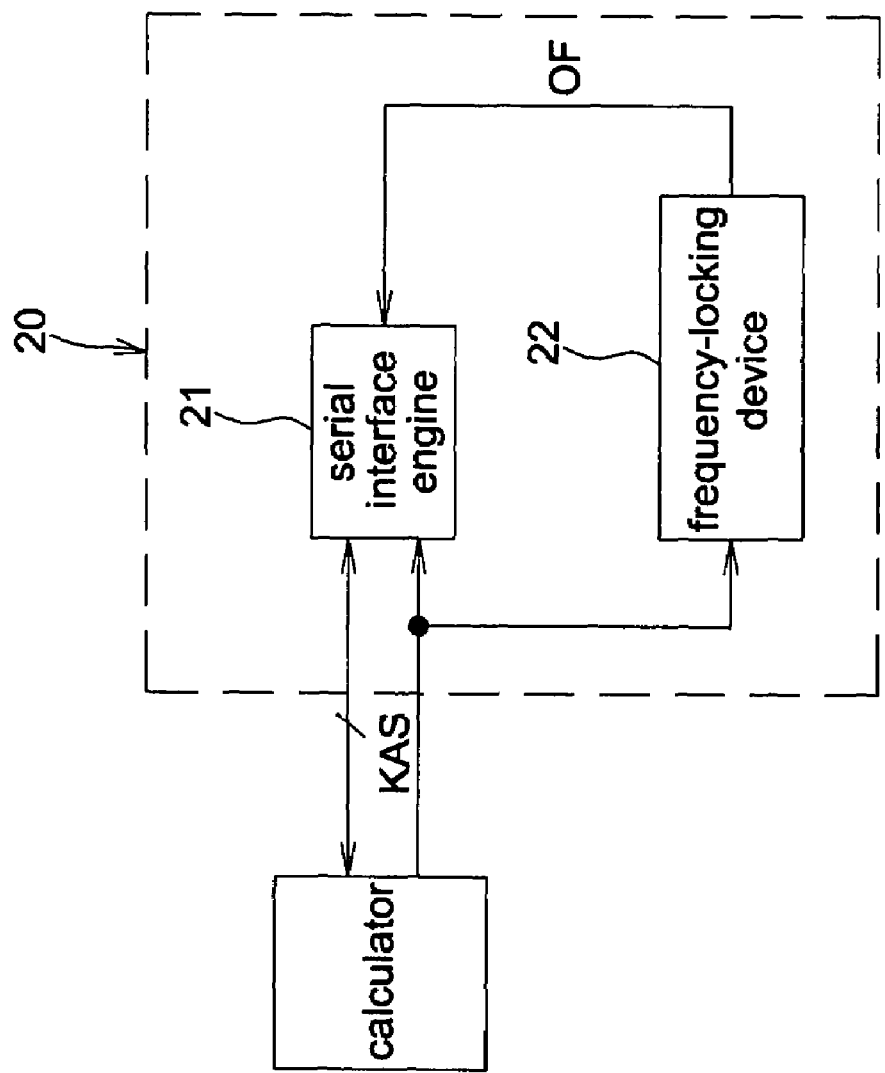
FIG. 2 shows a schematic diagram illustrating a universal serial bus device according to one embodiment of the invention.

Referring to FIG. 2, the universal serial bus device 20 according to one embodiment of the present invention receives the KEEP ALIVE signal generated by a calculator such as a computer, and has data communication with the calculator. The universal serial bus device 20 includes a serial interface engine (SIE) 21 and a frequency-locking device 22. Both the serial interface engine 21 and the frequency-locking device 22 receive a KEEP ALIVE signal KAS, and the frequency-locking device 22 generates an output frequency signal OF according to the KEEP ALIVE signal KAS. The frequency of the output frequency signal OF is locked to a specific or a predetermined frequency applied to the data communication between the calculator and the universal serial bus device 20. The specific or the predetermined frequency is such as the communication frequency according to the low speed universal serial bus (USB) specification. Then, the output frequency signal OF is served as the operation frequency of data communication between the serial interface engine 21 and the calculator. It is to be noted that the generated output frequency signal OF has 1.5% frequency accuracy conforming to the low-speed USB 2.0 specification when the frequency-locking device 22 operates.

Figure 3A:
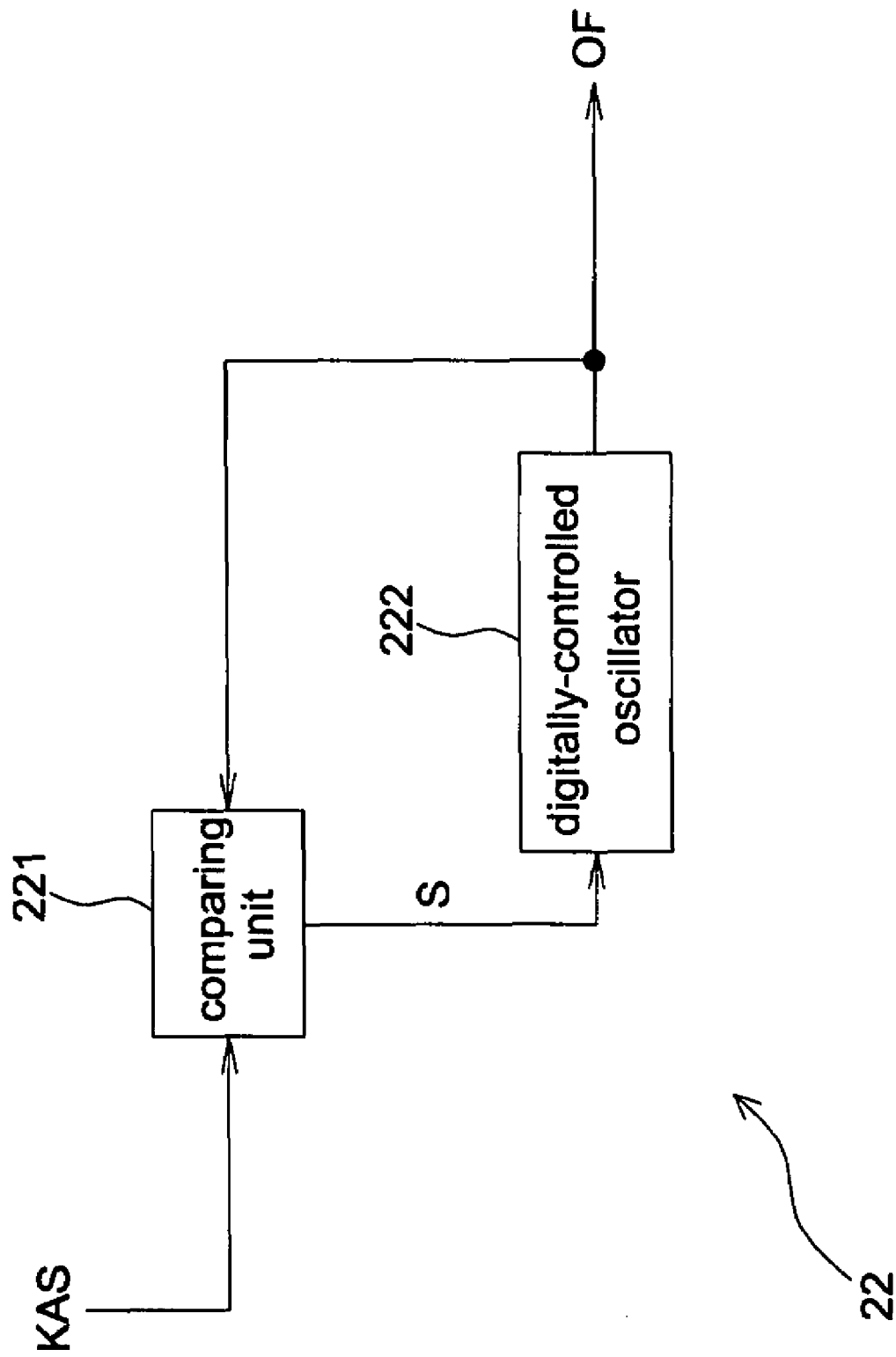
FIG. 3A shows a schematic diagram illustrating a frequency-locking device according to one embodiment of the invention.

Referring to FIG. 3A, the frequency-locking device 22 according to one embodiment of the invention includes a comparing unit 221 and a digitally-controlled oscillator 222. The comparing unit 221 receives a KEEP ALIVE signal KAS and an output frequency signal OF generated by the digitally-controlled oscillator 222, and generates a calibration signal S according to the comparison of the KEEP ALIVE signal KAS and the output frequency signal OF. The digitally-controlled oscillator 222 adjusts the frequency of the output frequency signal OF according to the calibration signal S.

Figure 3B:
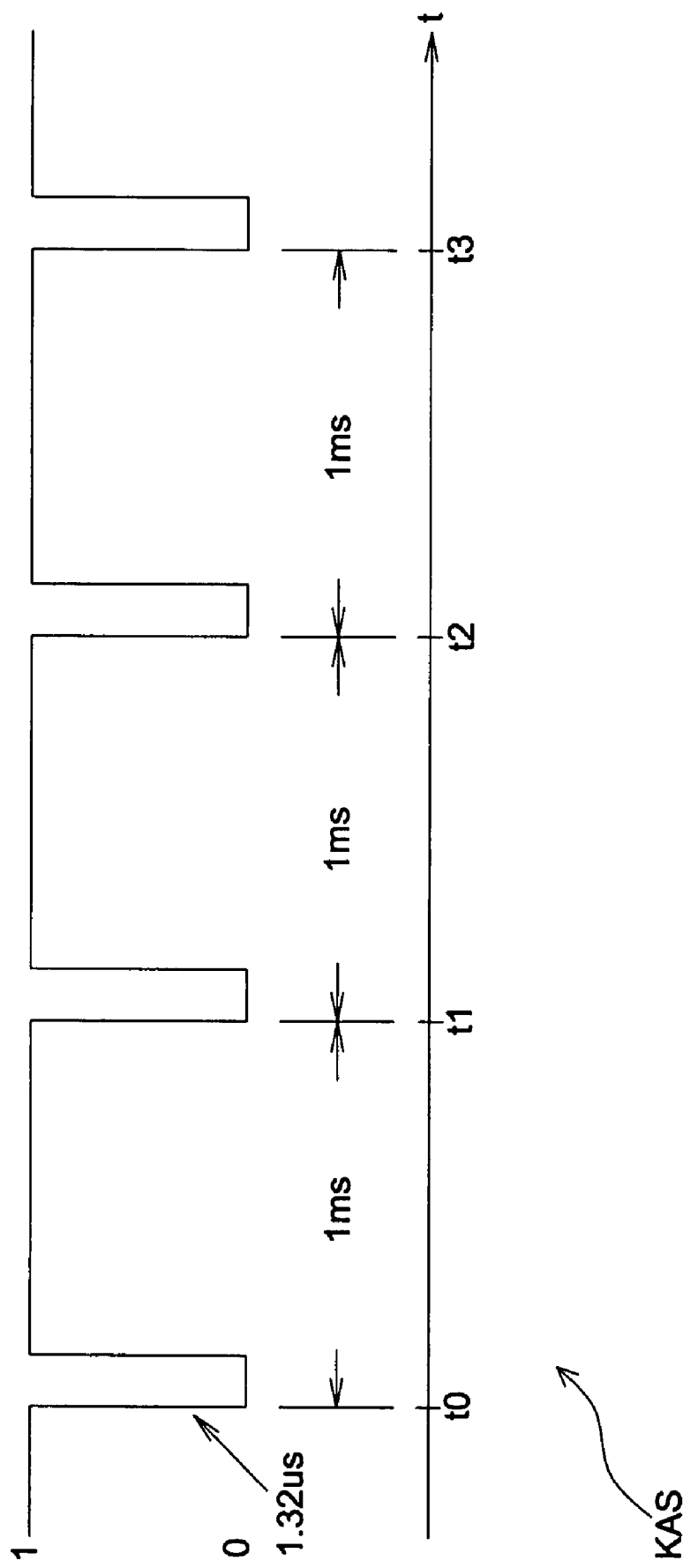
FIG. 3B shows a waveform diagram illustrating a standard KEEP ALIVE signal according to the low-speed USB 2.0 specification.

Referring to FIG. 3B, the standard KEEP ALIVE signal KAS used in the frequency-locking device 20 of the invention is based on the low-speed USB 2.0 specification and provided by the calculator for serving as a reference signal in the comparison to generate the calibration signal S. In this way, the frequency of the output frequency signal OF generated by the digitally-controlled oscillator 222 can be locked to a specific or predetermined frequency applied to communication of the universal serial bus device 20. In another embodiment, the frequency-locking device of the invention can even be used to deal with signals based on present or future USB specification.

Figure 3C:
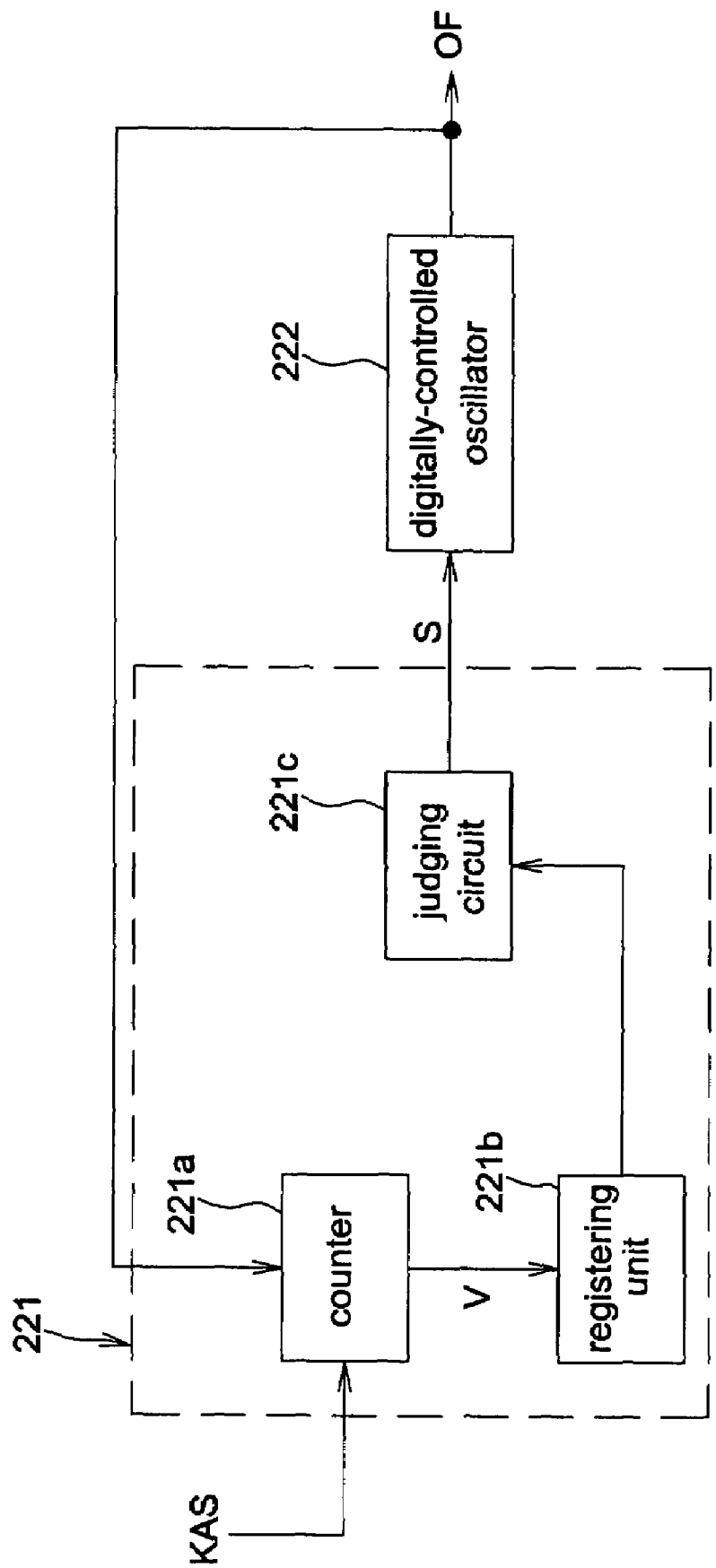
FIG. 3C shows a schematic diagram illustrating a comparing unit according to one embodiment of the invention.

Referring to FIG. 3C, the comparing unit 221 according to one embodiment of the invention includes a counter 221a, a registering unit 221b, and a judging circuit 221c. The counter 221a receives the KEEP ALIVE signal KAS and the output frequency signal OF, and starts or stops counting according to the KEEP ALIVE signal KAS. Referring to FIG. 3B, the counter 221a starts or stops counting when the voltage level of the KEEP ALIVE signal KAS varies. For example, the counter 221a starts clock counting of the output frequency signal OF when voltage level of the KEEP ALIVE signal KAS changes from 1 to 0 at time t0, and the counter 221a stops clock counting of the output frequency signal OF when voltage level of the KEEP ALIVE signal KAS changes from 1 to 0 at time t1. In this way, the clock number V of the output frequency signal OF can be calculated out in one period of the KEEP ALIVE signal KAS. It is to be noted that the control way of starting and stopping the counter 221a is not limited to the voltage level change between 1 and 0 of the KEEP ALIVE signal KAS but can be another method such as employing an external control signal.

The registering unit 221b is used for temporarily storing the clock number V. The judging circuit 221c receives the clock number V, and determines whether the calibration signal S is to be updated according to the clock number V and a predetermined threshold value TH. It is to be noted that the threshold value TH is designed to positively correlate with the specific or predetermined frequency applied to data communication of the universal serial bus device 20, the KEEP ALIVE signal KAS, and the operation frequency of the calculator.

For example, when the threshold value TH is set to be 100, the counter 221a counts and the counted clock number V of the output frequency signal OF is 92 in one period of the KEEP ALIVE signal KAS. Then, the judging circuit 221c receives the clock number V from the registering unit 221b and compares the clock number V with the threshold value TH. The result shows there is a difference of 8. Accordingly, the judging circuit 221c updates the calibration signal S by increasing its value such as adding a value of 2 and outputs the calibration signal S to the digitally-controlled oscillator 222. The clock number V of the output frequency signal OF then can be adjusted to be equal to the threshold value TH by repeating the above steps. Consequently, the frequency of the output frequency signal OF is locked to the specific or predetermined frequency applied to data communication of the universal serial bus device 20, and thereby the operation frequency of the serial interface engine 21 is synchronized with the operation frequency of the calculator so as to normalize data communication between the universal serial bus 20 and the calculator.

Figure 3D:
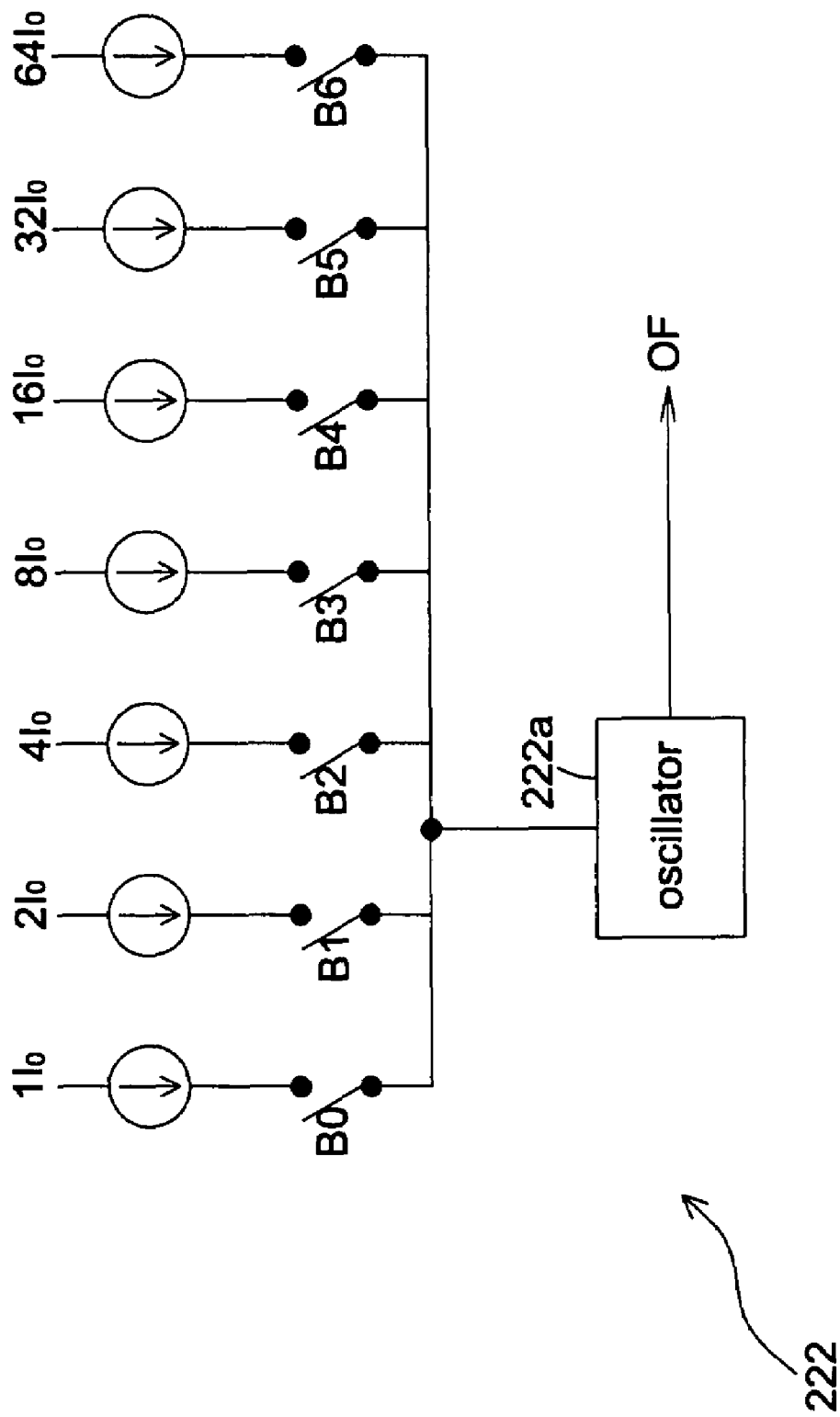
FIG. 3D shows a schematic diagram illustrating a digitally-controlled oscillator according to one embodiment of the invention.

Referring to FIG. 3D, the digitally-controlled oscillator 222 according to one embodiment of the invention is a current controlled oscillator (ICO), including N (a positive integer) current sources, N switches, and at least one oscillator 222a. The current sources provide N current flows of same or different magnitude such as the seven current sources of different magnitude $1I_0$, $2I_0$, $4I_0$, $8I_0$, $16I_0$, $32I_0$, $64I_0$ in FIG. 3D. The switches B0 to B6 each is turned ON or turned OFF according to the calibration signal S. The oscillator 222a generates the output frequency signal OF according to the sum of current flows passing the switch B0 to B6.

Figure 4:
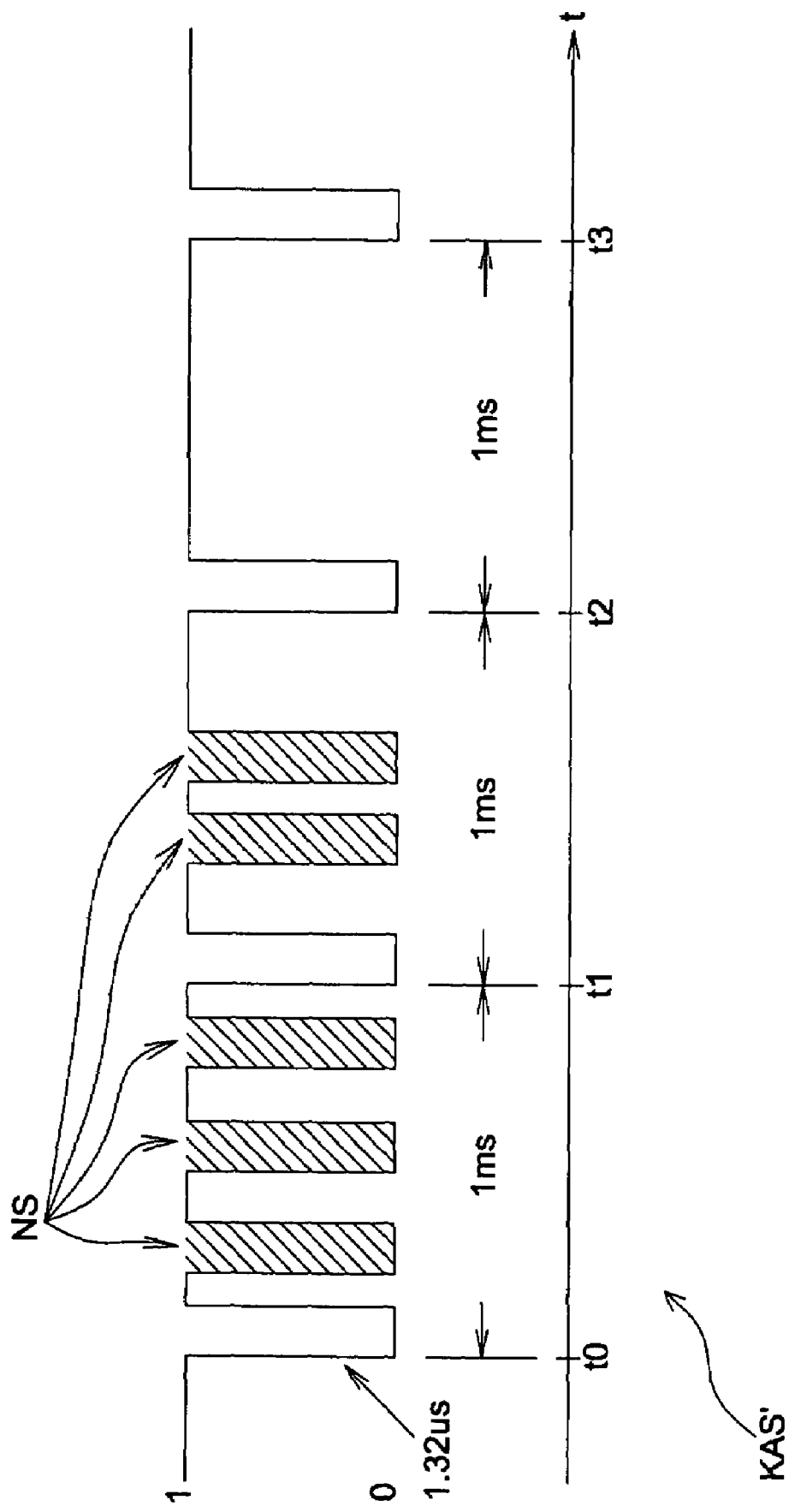
FIG. 4 shows a waveform diagram illustrating a real KEEP ALIVE signal according to low-speed USB 2.0 specification.
Figure 5:
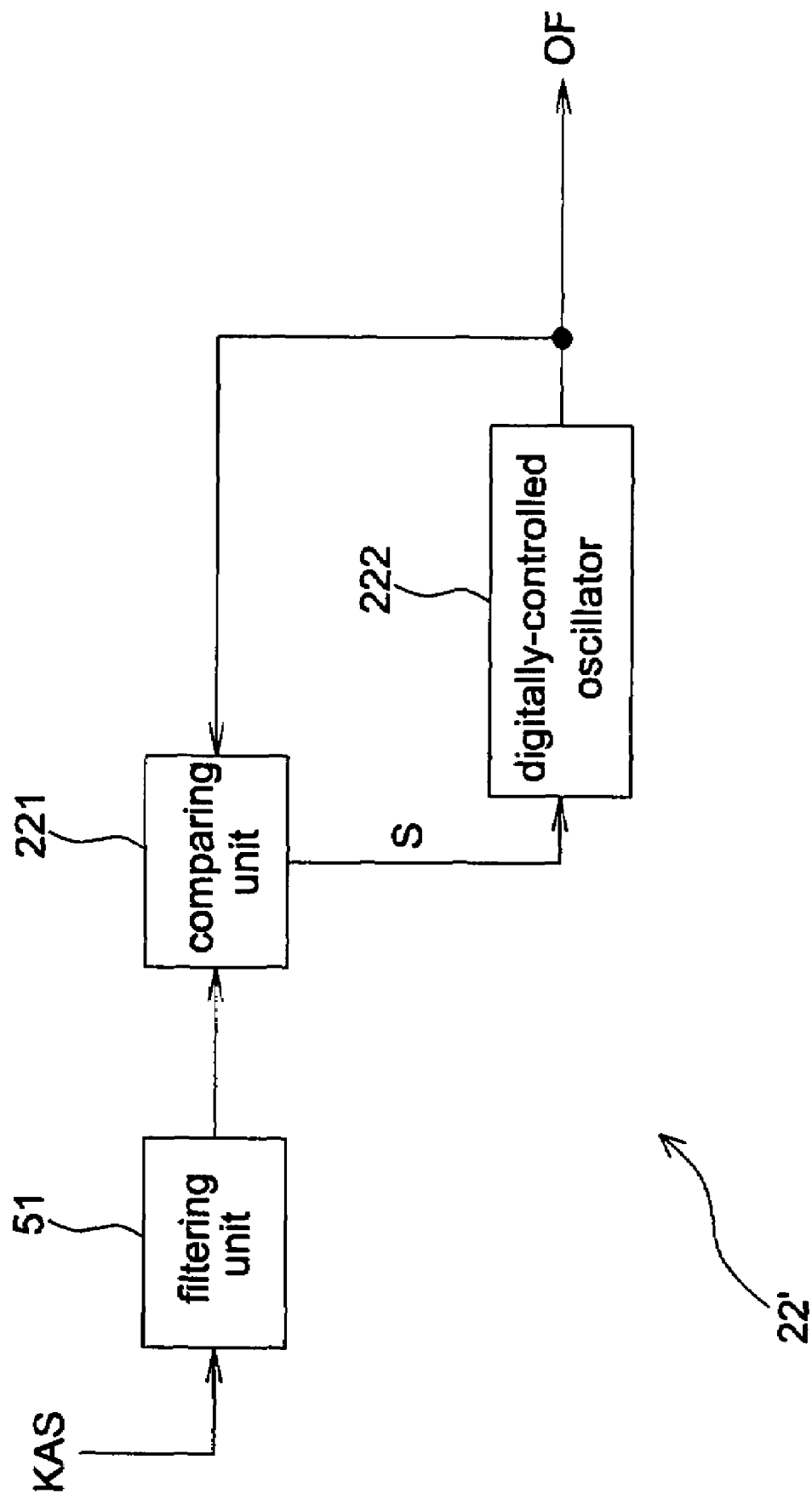
FIG. 5 shows a schematic diagram illustrating a frequency-locking device according to another embodiment of the invention.

In some situations, the KEEP ALIVE signal KAS output from the calculator may includes noises such as the marked area NS of the KEEP ALIVE signal KAS' shown in FIG. 4, and these noises NS may cause the comparing unit 221 to error. Therefore, as shown in FIG. 5, the frequency-locking device 22' according to another embodiment of the invention is provided with a filtering unit 51 before the comparing unit 221. The filtering unit 51 is used to filter the noises such as the marked area NS in FIG. 4, so that the KEEP ALIVE signal KAS' becomes standard KEEP ALIVE signal KAS shown in FIG. 3B, and the comparing unit 221 can be free from the noise interference. Thereby, a more precise comparison can be achieved.

Figure 6:
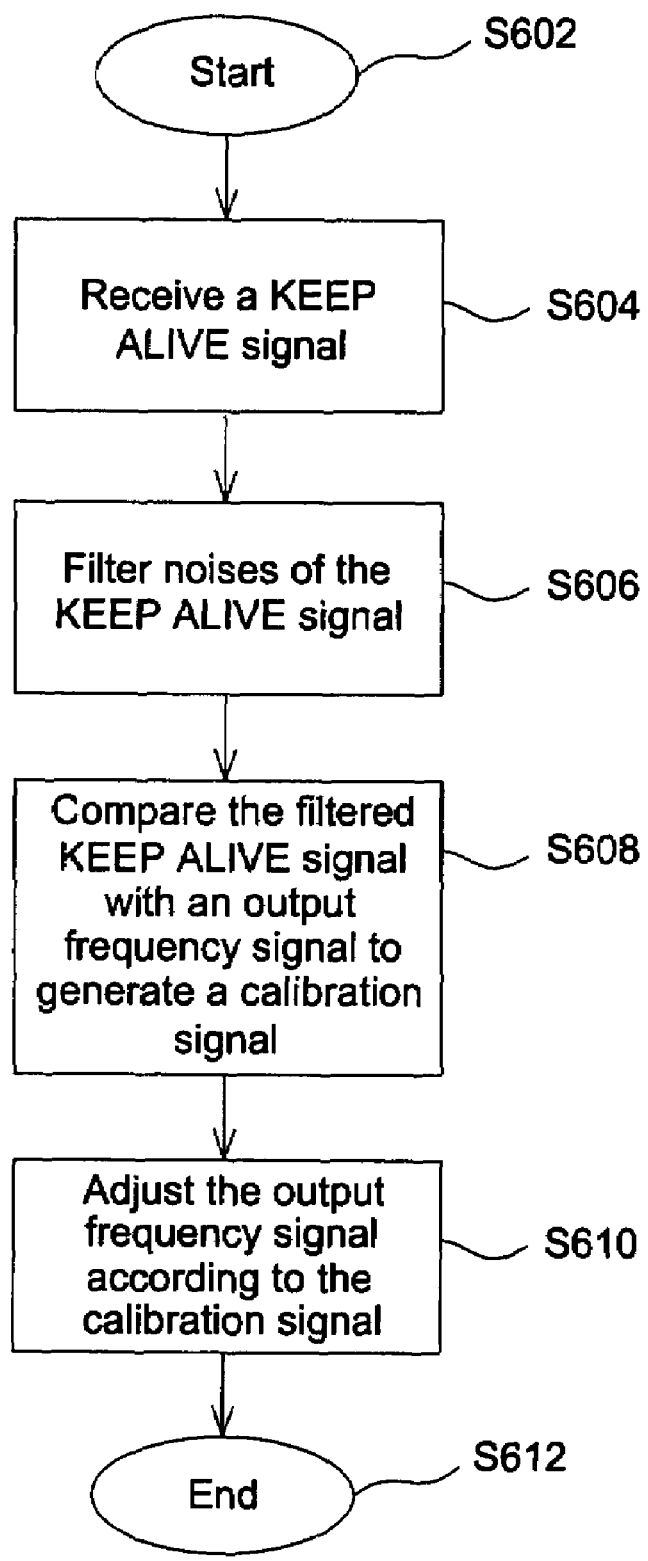
FIG. 6 shows a flowchart illustrating a frequency-locking method according to one embodiment of the invention.

FIG. 6 shows a flowchart illustrating a frequency-locking method according to one embodiment of the invention. The method includes the steps described below.

Step S602: Start.
Step S604: Receive a KEEP ALIVE signal.
Step S606: Filter noises of the KEEP ALIVE signal.
Step S608: Compare the filtered KEEP ALIVE signal with an output frequency signal to generate a calibration signal.
Step S610: Adjust the output frequency signal according to the calibration signal, and lock the frequency of the output frequency signal to a specific or predetermined frequency applied to data communication of a universal serial bus device.
Step S612: End.

The above-mentioned KEEP ALIVE signal satisfies the low-speed USB 2.0 specification.

To summarize, the frequency-locking device and the locking method according to the invention is accomplished by taking a KEEP ALIVE signal as the reference target for the comparing unit to generate the calibration signal. In this way, the frequency-locking effect can be achieved without using complicated packet data as reference for correction. On the other hand, the frequency-locking device according to the invention only needs a registering unit with smaller memory space to temporarily store counting values rather than a look-up table used in prior art. Therefore, the frequency-locking device according to the invention is designed with simpler circuit, reduced cost, and lowered electricity consumption.

While the invention has been described by way of examples and in terms of the preferred embodiments, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A frequency-locking device, comprising:
    a digitally-controlled oscillator for generating an output frequency signal; and
    a comparing unit for receiving a KEEP ALIVE signal and the output frequency signal and comparing the KEEP ALIVE signal with the output frequency signal to generate a calibration signal, the comparing unit comprising:
    a counter for starting and stopping counting according to the KEEP ALIVE signal, and counting the clock number of the output frequency signal in one period of the KEEP ALIVE signal;
    a registering unit for storing the clock number; and
    a judging circuit for determining whether to update the calibration signal according to the clock number and a predetermined threshold value;
    wherein, the digitally-controlled oscillator adjusts the output frequency signal according to the updated calibration signal.

2. The frequency-locking device as set forth in claim 1, wherein frequency of the output frequency signal is adjusted to be locked to a specific or predetermined frequency for data communication of a universal serial bus.

3. The frequency-locking device as set forth in claim 1, further comprising a filtering unit for filtering noises of the KEEP ALIVE signal.

4. The frequency-locking device as set forth in claim 1, wherein the digitally-controlled oscillator is a current controlled oscillator and comprises:
    N current sources (N is a positive integer) for generating N current of same or different magnitude;
    N switches, wherein each switch turns on and connects to one of the current sources, or turns off and disconnects to one of the current sources according to the calibration signal; and
    at least one oscillator for generating the output frequency signal according to the sum of currents passing through the N switches.

5. The frequency-locking device as set forth in claim 1, wherein the comparing unit comprises:
    a counter which starts or stops counting according to the KEEP ALIVE signal, the counter being used for counting the clock numbers of the output frequency signal in one period of the KEEP ALIVE signal; and
    a judging circuit for determining whether the calibration signal is to be updated according to the clock number and a predetermined threshold value.

6. The frequency-locking device as set forth in claim 1, wherein the KEEP ALIVE signal conforms to low-speed USB 2.0 specification.

7. A universal serial bus device, comprising:
    a serial interface engine receiving a KEEP ALIVE signal with an output frequency signal served as operation frequency of the serial interface engine;
    a digitally-controlled oscillator for generating the output frequency signal; and
    a comparing unit receiving the KEEP ALIVE signal and the output frequency signal and comparing the KEEP ALIVE signal with the output frequency signal to generate a calibration signal, the comparing unit comprising:
    a counter for starting or stopping counting according to the KEEP ALIVE signal, and counting the clock number of the output frequency signal in one period of the KEEP ALIVE signal;
    a registering unit for storing the clock number; and
    a judging circuit for determining whether to update the calibration signal according to the clock number and a predetermined threshold value;
    wherein, the digitally-controlled oscillator adjusts the output frequency signal according to the calibration signal.

8. The universal serial bus device as set forth in claim 7, wherein frequency of the output frequency signal is adjusted to be locked to a specific or predetermined frequency for data communication of the universal serial bus device.

9. The universal serial bus device as set forth in claim 7, further comprising a filtering unit for filtering noises of the KEEP ALIVE signal.

10. The universal serial bus device as set forth in claim 7, wherein the digitally-controlled oscillator is a current controlled oscillator and comprises:

N current sources (N is a positive integer) for generating N current of same or different magnitude;

N switches, wherein each switch turns on and connects to one of the current sources, or turns off and disconnects to one of the current sources according to the calibration signal; and at least one oscillator for generating the output frequency signal according to the sum of currents passing through the N switches.

11. The universal serial bus device as set forth in claim 7, wherein the comparing unit comprises:

a counter which starts or stops counting according to the KEEP ALIVE signal, the counter being used for counting the clock numbers of the output frequency signal in one period of the KEEP ALIVE signal; and a judging circuit for determining whether the calibration signal is to be updated according to the clock number and a predetermined threshold value.

12. The universal serial bus device as set forth in claim 7, wherein the KEEP ALIVE signal conforms to low-speed USB 2.0 specification.

* * * * *